United States Patent [19]
Chaki

[11] Patent Number: 4,501,165
[45] Date of Patent: Feb. 26, 1985

[54] CROSS ARM MECHANISM IN A PUSHBUTTON TUNER

[75] Inventor: Takao Chaki, Tokyo, Japan

[73] Assignee: Clarion Co., Ltd., Tokyo, Japan

[21] Appl. No.: 379,545

[22] Filed: May 18, 1982

[30] Foreign Application Priority Data

| May 18, 1981 | [JP] | Japan | 56-70485[U] |
| May 18, 1981 | [JP] | Japan | 56-70486[U] |
| May 18, 1981 | [JP] | Japan | 56-70487[U] |
| May 18, 1981 | [JP] | Japan | 56-70488[U] |
| May 27, 1981 | [JP] | Japan | 56-75860[U] |
| May 28, 1981 | [JP] | Japan | 56-76581[U] |
| May 28, 1981 | [JP] | Japan | 56-76582[U] |
| May 28, 1981 | [JP] | Japan | 56-76583[U] |
| May 29, 1981 | [JP] | Japan | 56-77397[U] |

[51] Int. Cl.³ .................................. H03J 5/12
[52] U.S. Cl. ........................... 74/10.33; 74/10.8; 334/7
[58] Field of Search ............ 74/10.33, 10.8; 334/7

[56] References Cited

U.S. PATENT DOCUMENTS

| 2,503,121 | 4/1950 | Mills | 74/10.33 |
| 3,737,817 | 6/1973 | Ashida et al. | 334/7 |
| 4,041,422 | 8/1977 | Noji et al. | 74/10.8 |
| 4,133,214 | 1/1979 | Cicala | 74/10.33 |
| 4,262,547 | 4/1981 | Kanai et al. | 74/10.33 |
| 4,279,170 | 7/1981 | Righi et al. | 334/7 |
| 4,331,038 | 5/1982 | Naoi | 74/10.33 |

FOREIGN PATENT DOCUMENTS

| 0082531 | 6/1980 | Japan | 74/10.33 |
| 0107324 | 8/1980 | Japan | 74/10.33 |
| 0125718 | 9/1980 | Japan | 74/10.33 |
| 0065921 | 4/1982 | Japan | 334/7 |
| 7805396 | 11/1978 | Netherlands | 74/10.33 |
| 2031673 | 4/1980 | United Kingdom | 74/10.33 |
| 2060296 | 4/1981 | United Kingdom | 74/10.33 |

*Primary Examiner*—Allan D. Herrmann
*Attorney, Agent, or Firm*—Flynn, Thiel, Boutell & Tanis

[57] ABSTRACT

In a pushbutton tuner wherein cross arms are mounted with their flat surface parallel with the surface of the tuner base, a cross arm mechanism includes a pivotally supporting portion of a frequency setting member inserted in an engaging hole of a fixing plate mounted along the cross arm, a slit which is formed in the fixing plate so as to open at one end of the same to be inserted in the pushbutton extends to a hole formed in the same by passing through the engaging hole, and a pair of side faces for receiving a force which narrows the slit are formed at both sides of the end of the fixing plate where the slit opens, so that contacting portions formed on a slide member slidable in response to advance of the pushbutton come to stress the side faces.

9 Claims, 21 Drawing Figures

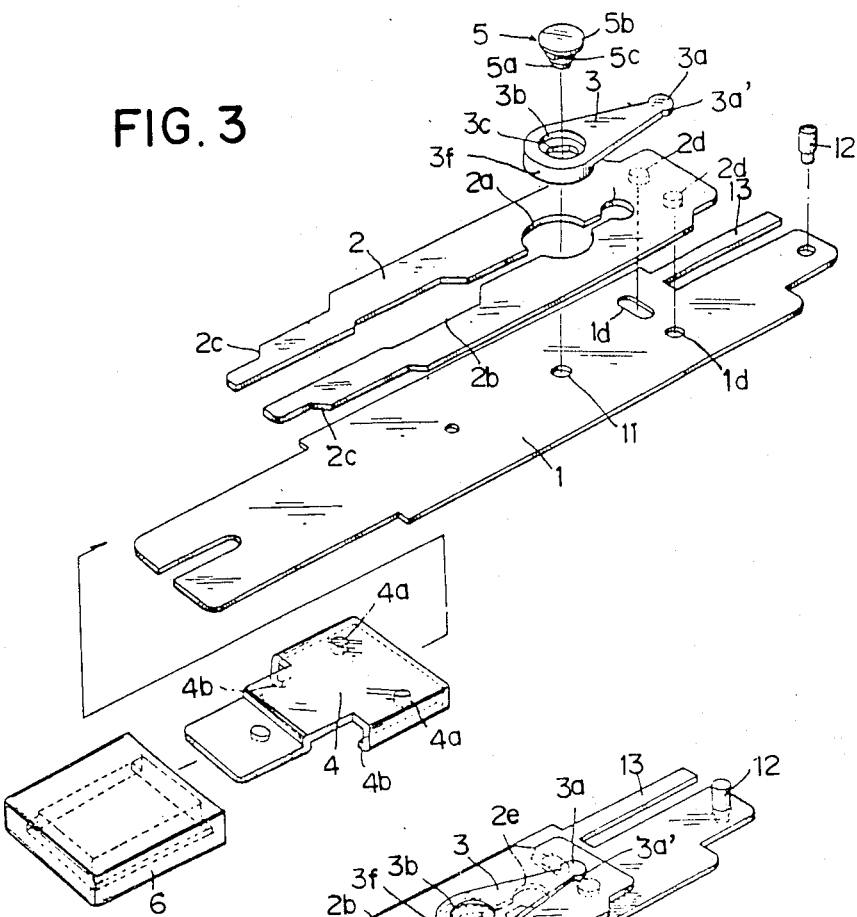
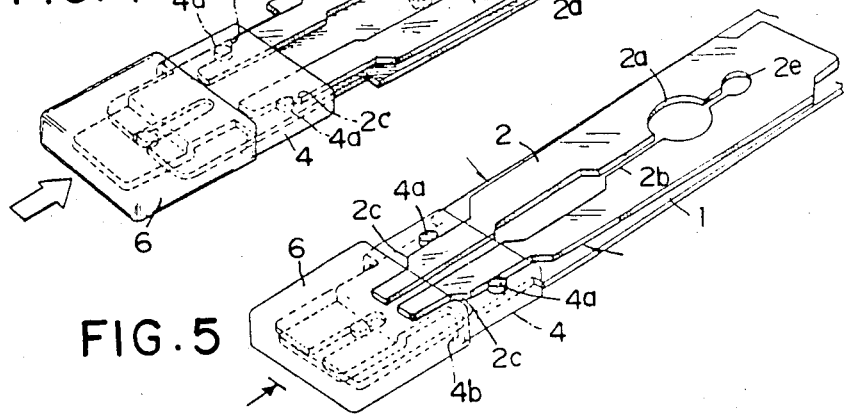

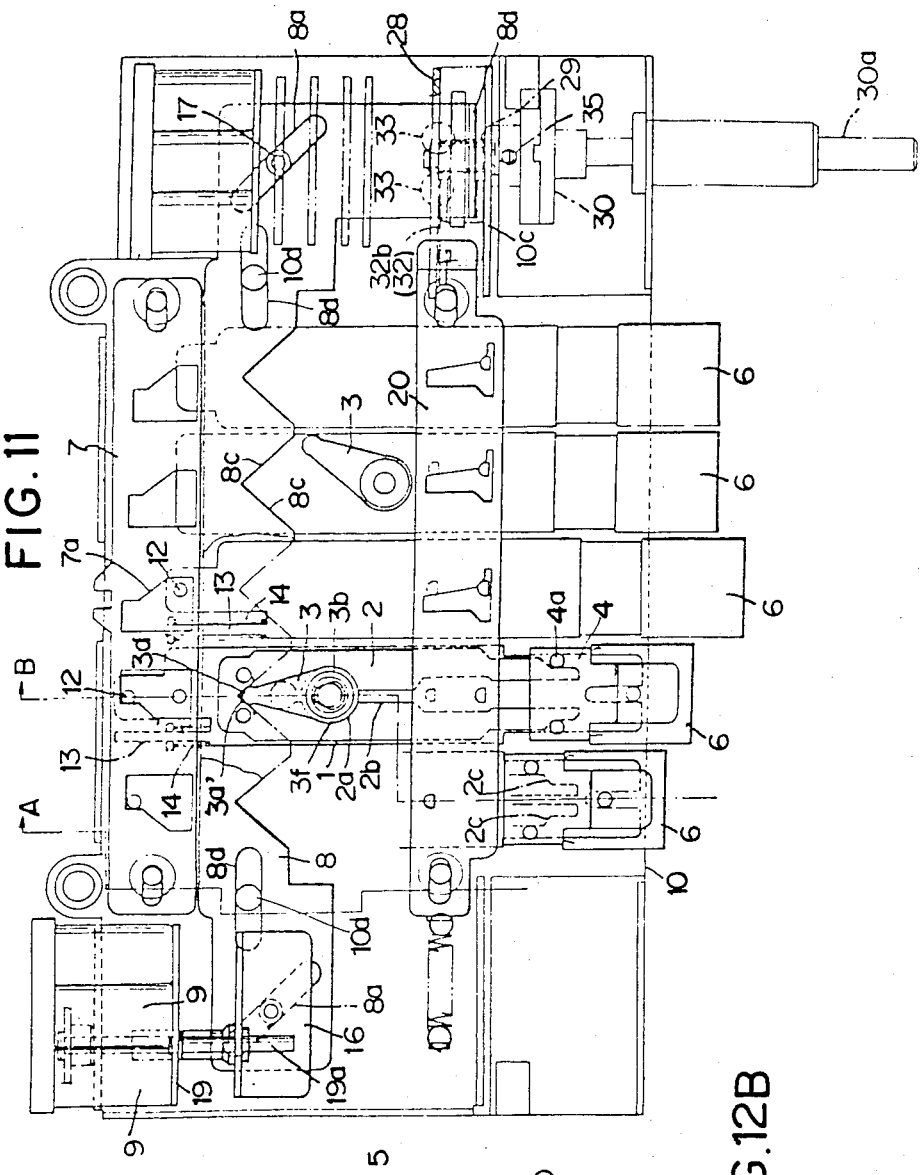

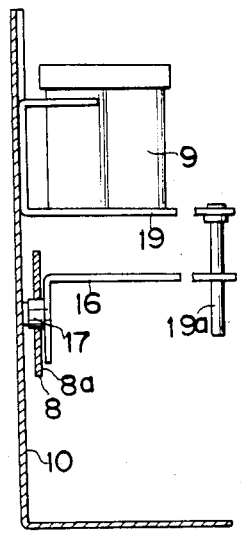
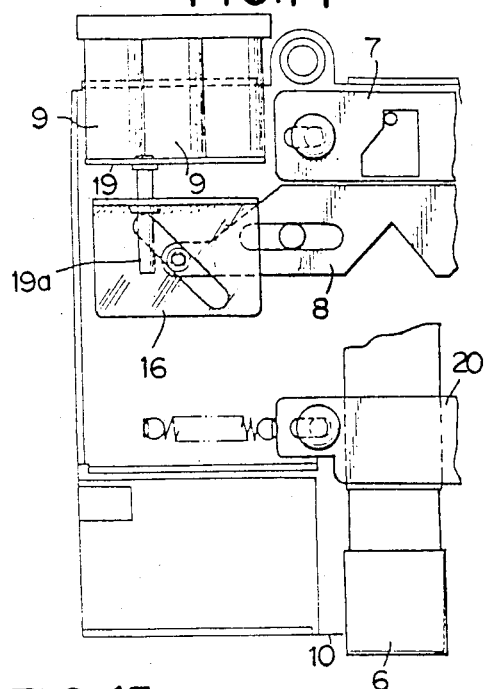
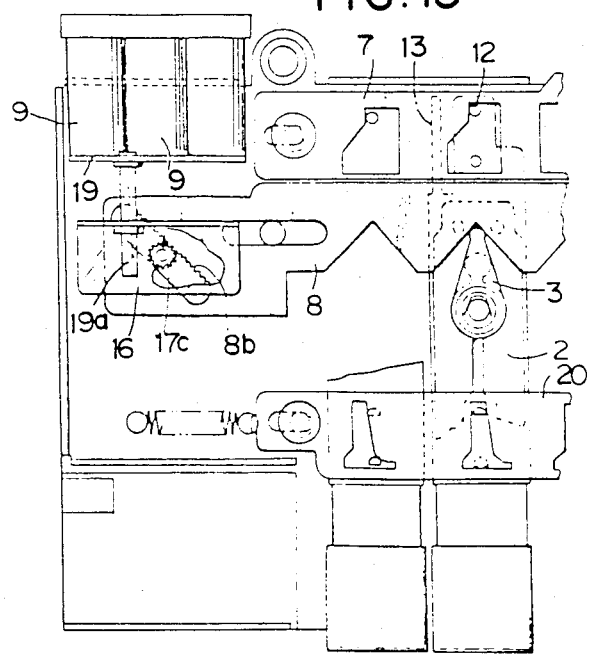

CROSS ARM MECHANISM IN A PUSHBUTTON TUNER

BACKGROUND OF THE INVENTION

1. Field of the Invention

This invention relates to a pushbutton tuner and more particularly to improvements in its cross arm mechanism which permits the pushbutton tuner to be made thin at least at the position for mounting the pushbuttons and to be suitably combined with receivers and the like.

2. Description of the Prior Art

Pushbutton tuners in general, if being designed thin at their part for mounting pushbuttons, will be practically advantageous because they may suitably be combined with receivers and the like and may be mounted on cars, etc. without occupying large space. To this end, there have been proposed various improvements in a thin-type pushbutton tuner where cross arms are placed with their plate surfaces being in parallel with the tuner base surface.

However, such conventional improvements have attained only limited effects in reduction of thickness, that is, a pushbutton tuner could not be made thinner than 5 to 6 times or more of the thickness of the cross arm for the following reasons: a frequency setting member is so mounted on the cross arm placed in parallel with the tuner base surface as to be rotatable and to vary its setting direction; a pressing plate is laid over and coupled with the frequency setting member by a connecting pin for pressing and fixing the frequency setting member in its thickness direction, the pressing plate being arranged so as to press and fix at the top end thereof the frequency setting member when the proximal end thereof is raised above the surface of the cross arm by pushing the pushbutton; the whole assembly of the cross arm should be so mounted on the tuner body as to be freely pushed or operated; and a kick member has to be mounted in a manner crossing the cross arm for releasing operatively connected relations of interlocking members for fine tuning operations by a clutch mechanism, the kick member having a protuberance on which the cross arm acts. In addition to that, such conventional tuner still has a considerable thickness as mentioned in the above, and there remains play space between members mounted therein. So, even if thinning of the tuner were attained, it could not have sufficient strength due to the play space in the part where the cross arms are mounted.

OBJECT OF THE INVENTION

It is therefore an object of the present invention to overcome the drawbacks in the conventional pushbutton tuners as mentioned in the above. In this connection, the present invention succeeded in further thinning thin-type pushbutton tuners, improving the strength of members coupled with each other and realizing smooth setting operation of a frequency setting member.

SUMMARY OF THE INVENTION

In accordance with the present invention, there is provided a tuner operated by pushbuttons which comprises:

a plurality of cross arm members;

a pushbutton mounted on one end of each cross arm member;

a fixing plate mounted on each cross arm member, said fixing plate having an engaging hole and a slit communicating with said engaging hole and being formed at both sides of one end thereof where the slit opens with pressure receiving surfaces;

a frequency setting member being in engagement with engaging hole;

a slide member for being made to slide along said cross arm member and said fixing plate by said pushbutton, said slide member having pressing portions associated with said pressure receiving surfaces contacting with said pressure receiving portions to tighten said slit and lock said frequency setting member;

a memory slide member to be moved by said frequency setting member which gets in contact therewith when said pushbutton is pushed in;

a kick arm member operable in response to advance of said pushbutton;

a manually operable tuning shaft; and a clutch mechanism for normally keeping said tuning shaft engaging with said memory slide member and disengaging them in accordance with movement of said kick arm member.

BRIEF DESCRIPTION OF THE DRAWINGS

The drawings show embodiments according to the present invention, in which:

FIG. 3 shows a perspective view illustrating the separated parts of the cross arm mechanism according to the present invention;

FIG. 4 shows a perspective view illustrating the frequency setting member in its mounted but released condition;

FIG. 5 shows a perspective view where the fixing plate is pressed by the pushbutton and the slide plate from both sides thereof;

FIG. 11 shows a plan view wholly illustrating a pushbutton tuner to which a core shifting mechanism related to the present invention is applied;

FIG. 12(A) shows a sectional view of FIG. 11 taken along line A—A;

FIG. 12(B) shows a sectional view of FIG. 11 taken along line B—B;

FIG. 13 shows a side view sectioned at the part where the memory slide and the core slide are connected to each other;

FIG. 14 and FIG. 15 each partially shows a modification of the connected portion of FIG. 13;

DETAILED DESCRIPTION OF THE PREFERRED EMBODIMENTS

Figure 1:
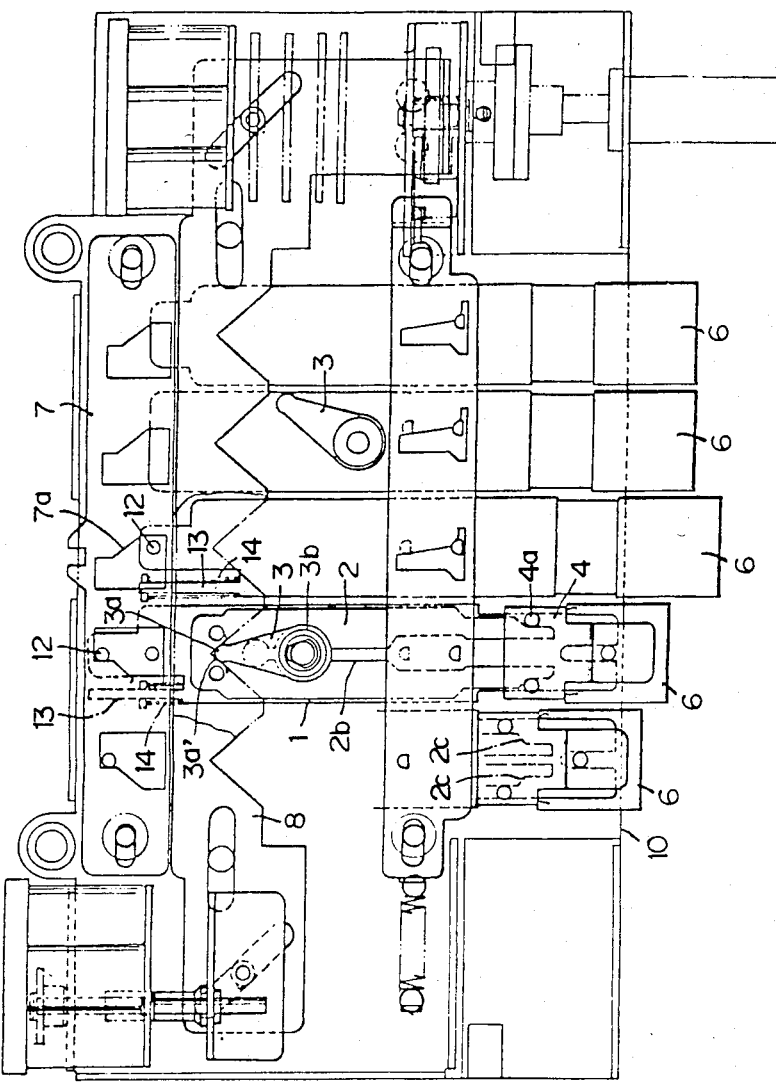
FIG. 1 shows a plan view wholly illustrating a pushbutton tuner to which a cross arm mechanism according to the present invention is applied.

The present invention will now be described in detail referring to the preferred embodiments illustrated in the drawings.

Figure 2:
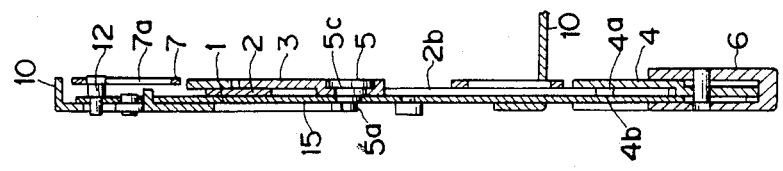
FIG. 2 shows a sectional view of FIG. 1.
Figure 6:
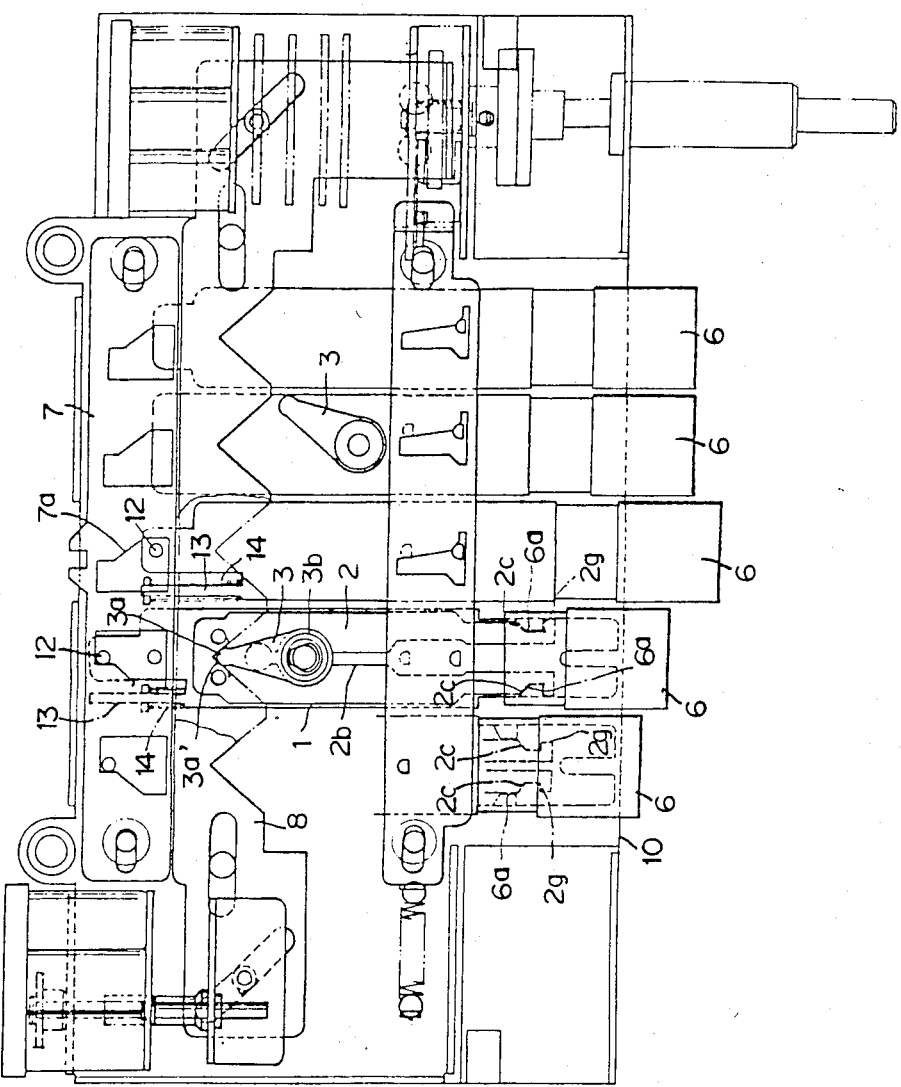
FIG. 6 shows a plan view wholly illustrating a pushbutton tuner to which another embodiment of the cross arm mechanism according to the present invention is applied.
Figure 7:
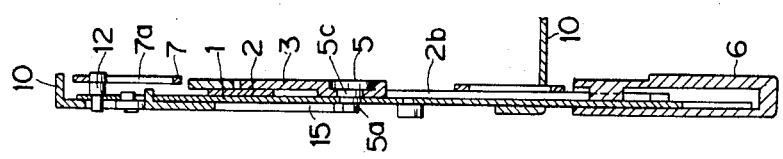
FIG. 7 shows a sectional view of FIG. 6.
Figure 8:
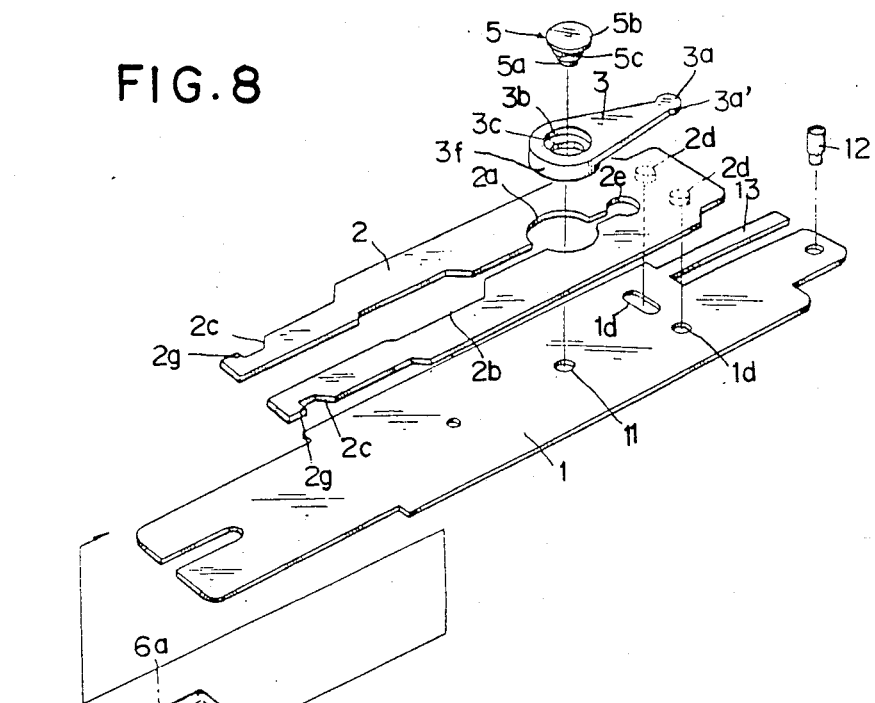
FIG. 8 shows a perspective view illustrating separated parts of a further embodiment of the cross arm mechanism according to the present invention.

The whole mechanism of the pushbutton tuner is as shown in FIG. 1 and FIG. 2, in which a plurality of cross arms 1 (about 5 pcs. in general), each having a pushbutton 6, are placed in an intermediate portion of a tuner base 10 with their plate surfaces being parallel with the surface of the tuner base 10. The structure of each cross arm mechanism thus placed is as shown in FIGS. 3 to 5. That is, a fixing plate 2 for fixing a frequency setting member 3 on a cross arm 1 is laid thereon with protuberances 2d formed parallel with each other at the top end thereof being inserted in holes 1d formed in the cross arm 1. One of the holes 1d is elongated while the other is round. The round hole 1d determines the position of the fixing plate 2 while the elongated hole 1d prevents the fixing plate 2 from rotating. The fixing plate 2 has an engaging hole 2a for receiving a pivotal support portion 3f of the frequency setting member 3, a slit or slot 2b extending from the engaging hole 2a and a round hole 2e communicating with the engaging hole 2a at the opposite direction of the slit 2b for making the fixing plate 1 flexible. At opposite sides of two parts of the fixing plate 2 separated by the slit 2b at the end portion thereof to be inserted in the pushbutton 6, there are formed a pair of side faces or pressure receiving surfaces 2c. A slide member 4 has a pair of protuberances 4a for acting on the side faces 2c of the fixing plate 2 and a pair of hooked holding portions 4b for keeping the slide member 4 coupled on the cross arm, the slide member 4 also being coupled with the pushbutton which is mounted at the proximal end of the cross arm 1. The frequency setting member 3 is formed at the top end thereof with an operational portion 3a having an outer periphery to serve as an operational surface 3a' for acting on a core slide 8.

Incidentally, in the cross arm mechanism as shown in FIGS. 3 to 5, in addition to the top end of the frequency setting member 3 which serves as the operational portion 3a, the proximal end thereof is formed with a pivotally supporting hole 3b for receiving a head 5b of a pivot 5. The top end 5a of the pivot 5 protrudes from the back surface of the cross arm 1 through a through hole 11 formed in the same and engages with a guide hole or slot 15 formed in the tuner base 10 as shown in FIG. 2 to guide pushing operation of the cross arm 1. The pivot 5 is further formed at the intermediate portion thereof with an engaging portion 5c engaging with an engaging hole 3c concentrical with the pivotally supporting hole 3b of the frequency setting member 3 in a manner preventing rotational movement therebetween.

The memory slide member 8 is provided with oppositely sloping surfaces for receiving actuation of the operational portion 3a of the frequency setting member 3. A protuberance 12 is provided at the top end of the cross arm 1 for engaging an operational hole 7a to operate a switch changeover plate 7. At one side of the top end portion of the cross arm 1 there is provided a spring hanger 13 to allow a spring to be interposed between the same and the tuner base 10 to reset the cross arm 1.

The mechanism according to the present invention as described in the above functions as follows: in the state as shown in FIG. 4, the side faces 2c of the fixing plate 2 do not receive pressing force from the protuberances 4a of the slide member 4 integrally slidable with the pushbutton 6, so that the frequency setting member 3 can adequately rotate to change the position of the operational portion 3a thereof. In this condition, when the pushbutton 6 is pushed in as shown by an arrow in FIG. 4 to inwardly press the side faces 2c with the protuberances 4a, the proximal end of the frequency setting member 3 positioned in the engaging hole 2a is prevented from rotating therein so that the frequency setting member 3 is fixed with respect to the cross arm 1 and the fixing plate 2. The operational surface 3a' of the frequency setting member 3 thus fixed acts on the slide memory member 8 as shown in FIG. 1. Because such press-fitting operation is done by the elongated slit 2b which extends from the round hole 2e to the portion thereof to be inserted in the pushbutton 6, it can be performed smoothly so as to firmly grasp the proximal end of the frequency setting member 3 by using each of the two parts of the fixing plate on both sides of the slit 2b as a long lever so as to fix immovable the frequency setting member 3 with respect to the cross arm 1 and the fixing plate 2 as shown in FIG. 5.

The embodiment as described in the above is so arranged that the cross arm 1 is placed in parallel with the surface of the tuner base 10. It is certain that the cross arm mechanism according to the present invention is particularly effective in such a thin type pushbutton tuner. However, even when the cross arm 1 is placed with its flat surface being perpendicular to the tuner base surface, the present invention can also be useful if appropriate modification is applied to the slide memory member 8.

As described in the above, according to the present invention, the pivotal support portion 3f at the proximal end of the frequency setting member 3 is inserted in the engaging hole 2a of the fixing plate 2 mounted along the cross arm 1 and it is prevented from rotating by inwardly pressing on the side faces 2c at both sides of the slit 2b of the fixing plate 2 by the slide member 4 which is moved together with the pushbutton 6 along the cross arm 1. Therefore, the pivotal support portion 3f of the frequency setting member 2 is perfectly covered within the thickness of the fixing plate 2, so that the total thickness of the cross arm mechanism can be kept to be about 3 times that of the cross arm 1. At the same time, because the cross arm 1 is mounted in a manner one over another with the fixing plate 2 and the slide member 4, it comes to be so strengthened as to allow reduction of the thickness. Reduction of the thickness at the cross arms and the vicinity due to advantages mentioned in the above provides a cross arm mechanism preferable to reduce thickness of tuners. Additionally, since the slit 2b is formed so long as to extend from the round hole 2e, through the engaging hole 2a to reach the end thereof to be inserted in the pushbutton 6, the two parts of the fixing plate 2 extending along both sides of the slit 2b are made flexible to permit a smooth operation of grasping the frequency setting member 3 and to firmly fix the same in the engaging hole 2a.

Further, since the frequency setting member 3 is provided with the operational portion 3a having the operational surface 3a' at the periphery thereof, it is not necessary to provide a pin-like protuberance which has been used in a conventional mechanism. This leads not only to simplification of the frequency setting member 3 but also to reduction of thickness for providing such pin-like protuberance, which permits sufficiently thin design of pushbutton tuners. Therefore, there remains a very small play space between members in the vicinity of the cross arms so as to endow the pushbutton tuner with sufficient strength and durability and to properly prevent tuning deviation caused by conical configuration of such pin-like protuberance.

The slide member 4 is formed with holding portions 4b for holding the cross arm 1 so as to ensure smooth and stable locking-in/out operations of the frequency setting member 3. The slide member 4 also serves to strengthen the part in the vicinity of the cross arm 1 and to reduce the parts to simplify the structure.

FIGS. 6 to 10 show another embodiment according to the present invention in which the pushbutton 6 mounted at the proximal end of the cross arm 1 is provided with protuberances 6a for acting on the side faces 2c and the fixing plate 2 is formed, at the top end thereof to be inserted in the pushbutton 6, with hooked portions 2g for engaging with the protuberances 6a.

Figure 9:
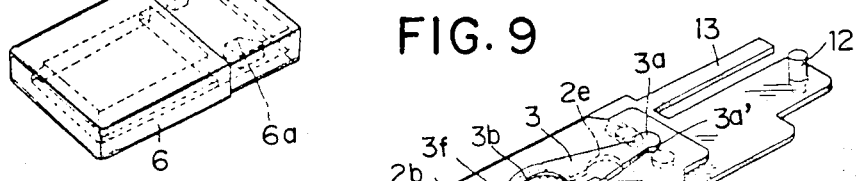
FIG. 9 shows a perspective view of the frequency setting member in its mounted but released condition.
Figure 10:
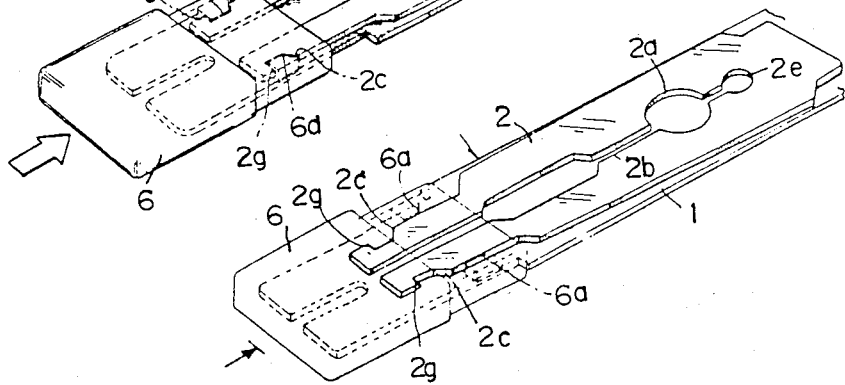
FIG. 10 shows a perspective view where the fixing plate is pressed by the pushbutton and the slide plate from both sides thereof.

The operation of the embodiment described above will now be described hereunder. In the state as shown in FIG. 9 where the side faces 2c of the fixing plate 2 are free from pressure from the protuberances 6a, the frequency setting member 3 can adequately rotate to change the position of the operational portion 3a. Then, when the pushbutton is pushed in as shown by the arrow in FIG. 9, the protuberances 6a come to inwardly stress the side faces 2c so that the proximal end of the frequency setting member 3 inserted in the engaging hole 2a is grasped in the same and the frequency setting member 3 is made immovable with respect to the cross arm 1 and the fixing plate 2 as shown in FIG. 10. The cross arm 1, in the locking-out condition where the side faces 2c are not stressed by the protuberances 6a as shown in FIG. 9, is prevented from getting out of the pushbutton by engaging the protuberances 6a with the hooked portions 2g while, in the locking-in condition, the pushbutton 6, cross arm 1 and the fixing plate make an integrally connected relation. This means that it is not necessary to provide any member separately and independently formed for preventing disengagement of the cross arm 1 from the pushbutton 6. So, the structure may be so simplified to allow the pushbutton 6 to automatically engage the fixing plate 2 upon their assemblage only by coupling the pushbutton 6 on the fixing plate 2 in a manner tightening the hooked portions 2g to pass the protuberances 6a through. Further, as this embodiment is so arranged that the pushbutton 6 has thereon the protuberances for acting on the side faces 2c of the fixing plate 2, it is not necessary to provide any special member for locking-in/out operation of this part, too. Beside this, as the fixing plate 2 is formed with hooked portions 2g for engaging the protuberances 6a, pins or other special members for coupling the pushbutton 6 to the cross arm 1 are not required, which leads to simplification of the structure and reduction of thickness at the place of the pushbuttons.

Next, a core slide operational mechanism in a pushbutton tuner to which the cross arm mechanism as shown in FIGS. 1 to 5 is applied will now be described referring to FIGS. 11 to 15.

The slide memory member 8 moves in axial directions of the tuner base 10 due to action of the operational portion 3a of the frequency setting member 3. Namely, the operational portion 3a faces contacting faces 8c comprising opposed slopes and the sliding motion is guided by the guide holes 8d formed at both sides of the slide memory member 8 and a pin 10d formed on the tuner base 10. In relation to the slide memory member 8, a core slide 16 is provided for in/out movement of a core (not shown) within a coil 9 mounted at a deep portion of the tuner base 10 with its axis being along the front-to-rear direction of the same. In this embodiment, particularly, in order to get interlocking relation between the slide memory member 8 and the core slide 16 and to get preferable operation of the core slide 16 by changing the operational direction of the slide memory member 8, the core slide 16 is formed at the bottom face thereof with a pin 17 while the slide memory member 8 is formed with a slanting hole or slot 8a for receiving the pin 17, so that the core slide 16 is made to slide toward the rear end of the tuner base 10 when the slide memory member 8 slides to the right in FIG. 11. The upright portion of the core slide 16 is guided by a guide member 19a of a support member 19 on which the coil 9 is mounted to perform in and out movement of the core in a proper condition as shown in the drawings.

It should be noted that the pin 17 and the slanting hole 8a may be provided in a manner reversed from that in the embodiment described in the above. Namely, a slanting hole 16a may be formed in the core slide 16 as shown in FIG. 14 while the pin 17 is formed on the slide memory member 8. In this case, although the area of the bottom face of the core slide 16 increases a little, the area required for engagement with the slanting hole 16a may be large enough only to form the pin 17 on. The pin 17, when a rotatable roller, functions more smoothly.

The core slide operational mechanism may be modified as shown in FIG. 15. That is, a gear 17c may be used instead of the pin. The gear 17c engages a rack 8b formed on the edge of the slanting hole 8a. With this arrangement, interlocking relation between the slide memory member 8 and the core slide 16 can always be obtained. In this case, if there is a gap between the gear 17c and the rack 8b, thus causing inaccuracy of their movement, the rack 8b may be designed to be double and may be provided with a spring and the like to prevent backlash which might occur when the rack comes to engage the gear and to improve their accuracy.

Further, since movement of the slide memory member 8 can adequately be changed to movement of core slide 16 in a different direction the core is made to advance and retire with respect to the coil 9 placed at the rear end portion of the tuner base 10, which leads to a tuning mechanism with relatively narrow width. Engagement between the slide memory member 8 and the core slide 16 is performed by a simple method using a slanting hole and a pin, so that it does not cause increase of thickness at that place when designing them changeable in their operational directions. This further leads to reduction of weight and production cost of tuners.

When arranging the slide memory member and the core slide to engage each other so that the slanting hole of the former is formed with a rack at the edge thereof while the latter is provided with a gear, their movement can be controlled with high accuracy.

Figure 16:
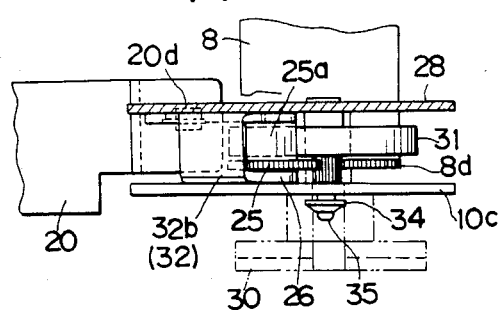
FIG. 16 shows a plan of the clutch mechanism related to the present invention.
Figure 17:
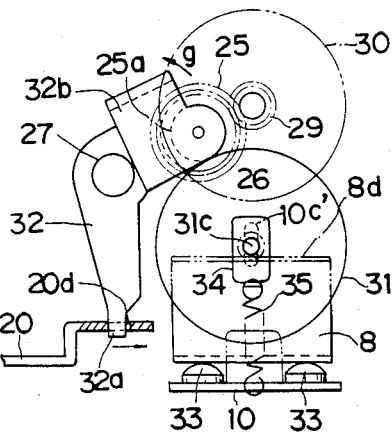
FIG. 17 shows a side view of FIG. 16.
Figure 18A:
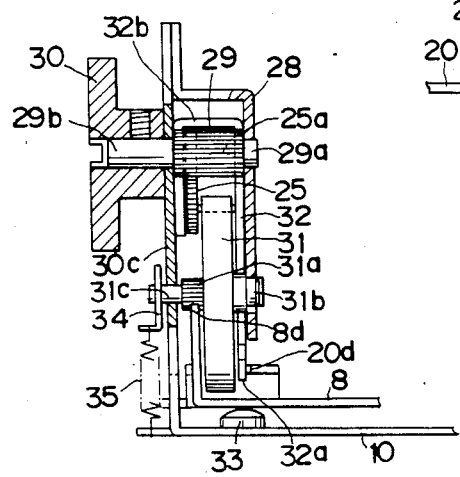
FIG. 18(A) shows a longitudinally sectional view along the axes of the gear and the rotatable member.
Figure 18B:
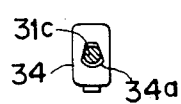
FIGS. 18(B) and (C) each shows a structure for pivotally supporting the interlocking wheels.
Figure 18C:
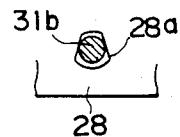

Between the memory slide 8 and a kick arm 20, a clutch mechanism as shown in FIGS. 16 to 18 is provided. The kick arm 20 is mounted on the tuner base 10 and in front of the memory slide 8 for right/left movement with respect to the tuner base 10 like the memory slide 8. Between the kick arm 20 and the tuner base 10, a spring 20s is provided for always applying a return force to the left to the kick arm 20. A manually operable tuning shaft 30a mounted on one side of the tuner base 10 is designed to adequately change its axis and is connected to a gear 29 mounted on a support plate 10c through a joint 30 for transmitting to further components the rotational force of the tuning shaft 30. The gear 29 engages an idler gear 25 with its axis secured on a clutch lever 32 in a position between the support plate 10c and another support plate 28 which is mounted in parallel with and apart from the support plate 10c. The idler 25 is rotatably mounted with its center to a support portion 32b of the clutch lever 32 which is connected with its center to the support plate 28 by a pin 27 as shown in FIG. 17. The proximal end 32a of the clutch lever 32 engages an engaging hole 20d of the kick arm 20 and is submitted to switching operation by the clutch lever 32. The idler gear 25 is integrally formed with a frictional rotatable portion 25a which is in contact with an interlocking wheel 31 also rotatably supported about an axis between the support plates 10c and 28. The interlocking wheel 31 has a gear portion 31a which is in engagement with a rack portion 8d of the memory slide 8 as shown in FIGS. 17 and 18. As shown in FIGS. 18(B) and (C), an end 31b of the axis of the interlocking wheel 31 is received in a downward V-shaped hole 28a of the support plate 28 while the other end 31c of the axis is received in an elongated hole 10c' of the support plate 10c and a downward U-shaped hole 34a in a support member 34. A spring 35 is provided between the support member 34 and the tuner base 10. The memory slide 8 is supported by semi-spherical surfaces on spherical support members 33 positioned on the tuner base as shown in FIGS. 17 and 18 so as to be operated with only a little friction.

The clutch mechanism related to the present invention is now described hereunder. When rotating the manually operated tuning shaft 30a, the idler gear 25 is rotated through the gear 29 to further rotate the interlocking wheel 31 by the frictional rotatable portion 25a. Then, the gear portion 31a causes movement of the memory slide 8 to cause the core to be moved in or out of the coil. Further, when one of the pushbuttons is pushed in, a protuberance thereof acts on a slanted portion 20g of the kick arm 20 to first operate the kick arm 20 and then in turn the lever 32 so as to shift the idler gear 25 as well as the frictional rotatable portion 25a in the direction as shown by the arrow in FIG. 17. Therefore, interlocking condition as to the manually tuning shaft 30a which has been made through the idler gear 25 comes to be released, and in this state, the frequency setting member 3 on the cross arm 1 acts on the memory slide 8, thus realizing a tuned condition at a desired wave band in a one-touch manner.

Thus, with this arrangement, either fine tuning operation by the manually operated tuning shaft or one-touch tuning operation by cross arms of the pushbuttons can be carried out. Beside this, since the idler 25 engaging the gear 29 is used as a clutch switching mechanism by the clutch lever 32, rotational interlocking relation by the manually operated tuning shaft 30a can be performed with high accuracy. Further, since the frictional rotatable portion 25a concentric of the idler gear 25 is so arranged as to be press-fit to the interlocking wheel 31, the interlocking wheel 31 is prevented from making undesired movement with respect to the memory slide 8 and its neighbours at the time of switching operation by the clutch lever 32 as shown in FIG. 17. Namely, deviation produced between the gears 25 and 29 upon such switching operation escapes to the manually operated tuning shaft 30a, so that frequency deviation which may be caused due to inaccuracy transmitted through the memory slide 8 can be avoided, resulting in solution of technically difficult problems in a conventional clutch mechanism in pushbutton tuners of this type.

Beside this, since the rack portion 8d of the memory slide 8 and the gear portion 31a provide accurate interlocking condition as to the manually operated tuning shaft 30a and the other end 31c of the axis of the gear portion 31a is received in the elongated hole 10c' of the support plate 10c and is connected to the tuner base 10 by way of the spring 35. So, the rack portion 8d and the gear portion 31a are kept closely engaging eath other without play space. This leads to a stable tuning function without frequency deviation due to backlash and the like.

In the clutch mechanism as mentioned in the above, to use a semisphere or a smaller one as the support member is particularly advantageous for reduction of thickness. Even when using only one support member 33, the slide memory 8 is stably supported. Of course, spheres or balls with a small diameter may be used. Owing to this method, the memory slide 8 contacts with the tuner base at points on the spherical supporting members 33. This leads to prominent operability permitting smooth and light sliding movement of the memory slide with only a small friction.

The embodiments of the invention in which an exclusive property or privilege is claimed are defined as follows:

1. A tuner operated by pushbuttons, comprising:
   a plurality of cross arm members supported for movement parallel to a first direction;
   a pushbutton slidably supported on one end of each said cross arm member;
   a cross arm slide member slidably supported on each said cross arm member and operatively coupled to the associated pushbutton;
   a fixing plate supported on each said cross arm member, said fixing plate having therein an engaging hole and a slit which extends into said fixing plate from one end thereof and which communicates with said engaging hole, said fixing plate having pressure receiving surfaces at said one end thereof on opposite sides of said slit;
   a frequency setting member movably supported in said engaging hole of each said fixing plate, said cross arm slide member having pressing portions thereon which are cooperable with said pressure receiving surfaces on said fixing plate as said cross arm slide member is moved relative to said cross arm member so as to pinch said one end of said fixing plate and thereby narrow said slit and said engaging hole in a manner clamping said frequency setting member against movement relative to said fixing plate and said cross arm member;
   a memory slide member supported for movement in a second direction approximately perpendicular to said first direction, each said frequency setting member having means cooperable with said memory slide member for effecting movement thereof when the associated pushbutton is pushed;
   a movably supported kick arm member and means for effecting movement thereof to an actuated position in response to pushing of one of said pushbuttons;

a rotatably supported, manually operable tuning shaft; and clutch means for normally operatively coupling said tuning shaft and said memory slide member so as to effect movement of said memory slide member in response to rotation of said tuning shaft, and for disengaging said tuning shaft and memory slide member in response to movement of said kick arm member to said actuated position.

2. A tuner as claimed in claim 1, wherein each said fixing plate has a plurality of protuberances thereon and the associated cross arm member has a plurality of holes which each receive a respective said protuberance.

3. A tuner as claimed in claim 1, wherein said means on each said frequency setting member for effecting movement of said memory slide member includes an operational surface on said frequency setting member which can slidably engage a surface on said memory slide member.

4. A tuner as claimed in claim 1, wherein each said cross arm slide member has holding portions cooperable with the associated cross arm member for slidably supporting the cross arm slide member on the cross arm member.

5. A tuner as claimed in claim 1, further comprising:
a tuning coil;
a core associated with said tuning coil;
a core slide member which has said core supported thereon and which is supported for reciprocal movement in a third direction approximately perpendicular to said second direction so as to cause said core to move in and out of said coil;
a protuberance provided on one of said core slide member and said memory slide member, and a slot provided in the other of said core slide member and said memory slide member and extending at an angle to said second and third directions, said protuberance being slidably received in said slot and effecting movement of said core slide member in response to movement of said memory slide member.

6. A tuner as claimed in claim 5, wherein a rack is formed along one edge of said slot, and wherein a gear which meshes with said rack is rotatably supported on said protuberance.

7. A tuner as claimed in claim 1, wherein said clutch means includes:
a movably supported clutch lever which is operatively coupled to and moves in response to movement of said kick arm;
a rotatably supported drive gear which is operatively coupled to and rotated in response to rotation of said manually operable tuning shaft;
an idler gear rotatably supported on said clutch lever, movement of said clutch lever moving said idler gear between positions in which it is engaged with and disengaged from said drive gear;
a rotatably supported interlocking wheel and means for moving said memory slide member in response to rotation of said interlocking wheel; and
a rotatably supported frictional member which is integral with said idler gear, movement of said clutch lever moving said frictional member between positions in which it is engaged with and disengaged from said interlocking wheel when said idler gear is respectively engaged with and disengaged from said drive gear.

8. A tuner as claimed in claim 7, wherein said means for moving said memory slide member in response to rotation of said interlocking wheel includes said interlocking wheel having a gear portion fixedly connected thereto and said memory slide member having a rack portion which is in meshing engagement with said gear portion.

9. A tuner as claimed in claim 18, including resilient means for urging said gear portion and said rack portion together in a manner preventing play therebetween.

* * * * *

UNITED STATES PATENT AND TRADEMARK OFFICE
CERTIFICATE OF CORRECTION

PATENT NO. : 4 501 165

DATED : February 26, 1985

INVENTOR(S) : Chaki, Takao

It is certified that error appears in the above-identified patent and that said Letters Patent is hereby corrected as shown below:

Column 10, line 36; change "claim 18" to ---claim 8---.

Signed and Sealed this

Thirteenth Day of August 1985

[SEAL]

Attest:

DONALD J. QUIGG

Attesting Officer     Acting Commissioner of Patents and Trademarks